US006492256B2

(12) United States Patent
Lee et al.

(10) Patent No.: US 6,492,256 B2
(45) Date of Patent: Dec. 10, 2002

(54) METHOD FOR FORMING AN INTERCONNECT STRUCTURE WITH AIR GAP COMPATIBLE WITH UNLANDED VIAS

(75) Inventors: Ellis Lee, Taipei (TW); Shih-Wei Sun, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/098,718

(22) Filed: Mar. 15, 2002

(65) Prior Publication Data

US 2002/0163082 A1 Nov. 7, 2002

Related U.S. Application Data

(62) Division of application No. 09/849,666, filed on May 4, 2001, which is a continuation-in-part of application No. 09/750,314, filed on Dec. 29, 2000, now abandoned, which is a continuation of application No. 08/948,368, filed on Oct. 9, 1997, now Pat. No. 6,350,672.
(60) Provisional application No. 60/053,914, filed on Jul. 28, 1997.

(51) Int. Cl.$^7$ .......................................... H01L 21/4763
(52) U.S. Cl. ..................... 438/619; 438/624; 438/637
(58) Field of Search ................................ 438/619, 622, 438/624, 637, 763, 781

(56) References Cited

U.S. PATENT DOCUMENTS 5,461,003 A * 10/1995 Havemann et al. .......... 437/187
5,708,303 A * 1/1998 Jeng ............................ 257/758
5,863,832 A * 1/1999 Doyle et al. ................. 438/622
5,994,776 A * 11/1999 Fang et al. ................... 257/758
2001/0040267 A1 * 11/2001 Lien et al. .................... 257/522

OTHER PUBLICATIONS

M. B. Anand et al., "NURA: A Feasible Gas–Dielectric Interconnect Process," IEEE 1996 Symposium on VLSI Technology Digest of Technical Papers, pp. 82–83, Jun. 1996.*

* cited by examiner

Primary Examiner—Olik Chaudhuri
Assistant Examiner—Stephen W. Smoot
(74) Attorney, Agent, or Firm—J. C. Patents (57) ABSTRACT

An interconnect structure has a substrate having devices already formed thereon. A dielectric layer covers over the substrate. A conductive structure having at least two substructure separated by an air gap is formed on the dielectric layer. A capping layer covers the conductive structure and the air gap. The capping layer at a portion above the air gap also fills into the air gap by a predetermined distance. The air gap may also extend into the dielectric layer to have a greater height. An etching stop layer is formed on the capping layer. An inter-metal dielectric layer is formed on the etching stop layer. The inter-metal dielectric layer, the etching stop layer and the capping layer are patterned to form an opening that exposes a top surface of the conductive structure. The opening may also expose a top portion of a sidewall of the conductive structure if a misalignment occurs, but the opening does not expose the air gap due to protection from the predetermined distance of the capping layer within the air gap. A next level of conductive structure can be formed to fill the opening. A liner layer can be also formed on a sidewall of the substructure interfacing the air gap, so as to protect the conductive structure.

12 Claims, 12 Drawing Sheets

METHOD FOR FORMING AN INTERCONNECT STRUCTURE WITH AIR GAP COMPATIBLE WITH UNLANDED VIAS

CROSS-REFERENCE TO RELATED APPLICATIONS

This application is a divisional application of and claims the priority benefit of U.S. application Ser. No. 09/849,666 filed on May 4, 2001, which is a continuation-in-part of U.S. application Ser. No. 09/750,314 filed on Dec. 29, 2000 now abandoned, which is a continuation of U.S. application Ser. No. 08/948,368 filed on Oct. 9, 1997 now U.S. Pat. No. 6,350,672, which claims the benefits of U.S. provisional application Ser. No. 60/053,914 filed on Jul. 28, 1997.

BACKGROUND OF THE INVENTION

1. Field of Invention

The present invention relates to an integrated circuit structure. More particularly, the present invention relates to an interconnect structure with an air gap.

2. Description of Related Art

Modern integrated circuits include devices such as field effect transistor (FETs) or bipolar devices formed in and on a semiconductor substrate in combination with a multilevel interconnect structure formed above and in contact with the devices. The multilevel interconnect structure provides connections to and between different ones of the devices formed in the substrate and so is an increasingly important aspect of aggressive designs for integrated circuits. In many integrated circuits, the multilevel interconnect structure includes one or more arrays of wiring lines extending in parallel to provide connections to and between the devices in closely packed arrays of devices. Such arrays of devices are typical of integrated circuit memories and other aggressive circuit designs. Closely spaced, parallel wiring lines can provide undesirable levels of capacitive and inductive coupling between adjacent wiring lines, particularly for higher data transmission rates through the arrays of parallel wiring lines. Such capacitive and inductive coupling slow data transmission rates and increase energy consumption in a manner that can limit the performance of the integrated circuits. For some aggressive circuit designs, the delays and energy consumption associated with the circuit's interconnect structure are a significant limitation on the circuit's performance.

The complexity of modern interconnect structures has become a major cost component for integrated circuit designs. Various factors threaten to further increase the proportional expense of the interconnect structure within integrated circuits. For example, proposals have been advanced for substituting different interlayer and intermetal dielectric materials into multilevel interconnect structures to improve the coupling problem. The capacitive and inductive coupling between adjacent wiring lines is mediated by the dielectric material that separates the wiring lines. Present dielectric materials, such as silicon oxides deposited by chemical vapor deposition (CVD) from TEOS source gases, have comparatively high dielectric constant, and proposals have been made to replace these dielectric materials with dielectric materials having lower dielectric constant. Performance could be improved by replacing the higher dielectric constant materials with lower dielectric constant materials, with the theoretical minimum dielectric constant being provided by a gas or vacuum dielectric. Adoption of these alternate dielectric materials has not been completely satisfactory to this point in time, due to the increased cost and processing difficulty associated with these alternative materials.

Figure 1:
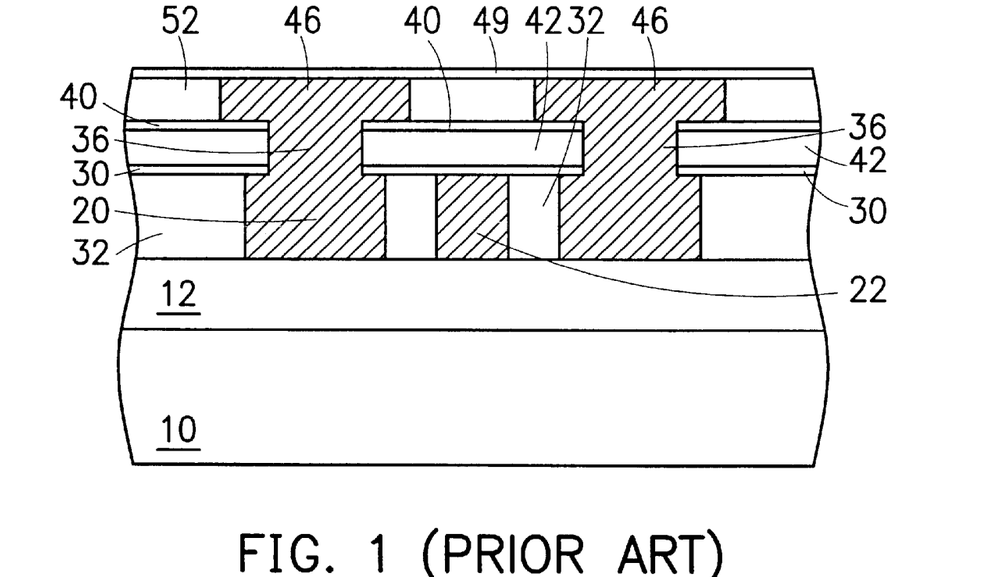
FIGS. 1–5 are cross-sectional views, schematically illustrating conventional process to form a conventional interconnect structure.

One promising implementation of a multilevel interconnect structure using an air dielectric, that is, air gap is proposed. FIG. 1 is a cross-sectional view, schematically illustrating a typical interconnect structure with an air gap design. In FIG. 1, the substrate 10 has various devices (not shown). A dielectric layer 12 is formed over the substrate 10. First level wiring lines 20, 22 extend along the surface of the dielectric layer 12 and are separated by air gaps 32. The use of air gaps, as compared to more conventional dielectric materials, ensures that there is a minimal level of coupling between the adjacent first level wiring lines 20, 22. The first level air gaps are bounded on the bottom by the dielectric layer 12 and on the top by a thin layer of silicon oxide 30. Contacts to the first level wiring lines 20 include vertical interconnects 36 that extend from the first level wiring lines 22 to the second level wiring lines 46. The first level wiring lines 22 and the second level wiring lines 46 are connected by the vertical interconnects 36 in between, where the inter-metal dielectric layer 42 separates the first level wiring lines 22 and the second level wiring lines 46. These via level air gaps reduce the extent of capacitive and inductive coupling between the first level wiring level wiring lines 20, 22 and the second level wiring lines 46, as compared to more conventional solid dielectric materials. In a similar fashion, second level air gaps 52, bounded on top and bottom by thin layers of silicon oxide 49, 40, are provided between the second level wiring lines 46 to reduce the level of capacitive and inductive coupling between the second wiring lines. Air gaps 32, 52 surround the wiring lines 20, 22, 46.

Figure 2:
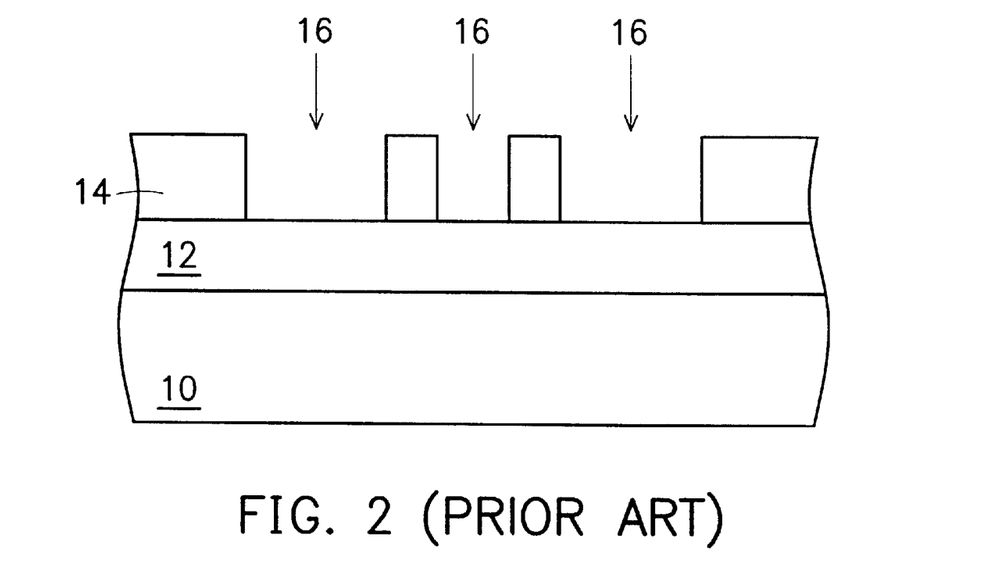

In order to fabricate the structure as shown in FIG. 1, a sequence of processes in cross-sectional view is shown in FIGS. 2–5. In FIG. 2, a carbon layer 14 is formed on the dielectric layer 12. The carbon layer 14 is patterned by photolithography and etching process, so as to form openings 16 that expose the dielectric layer. The location of the openings 16 is the location where an wiring lines, such as the wiring lines 20, 22 of FIG. 1, is to be formed.

Figure 3:
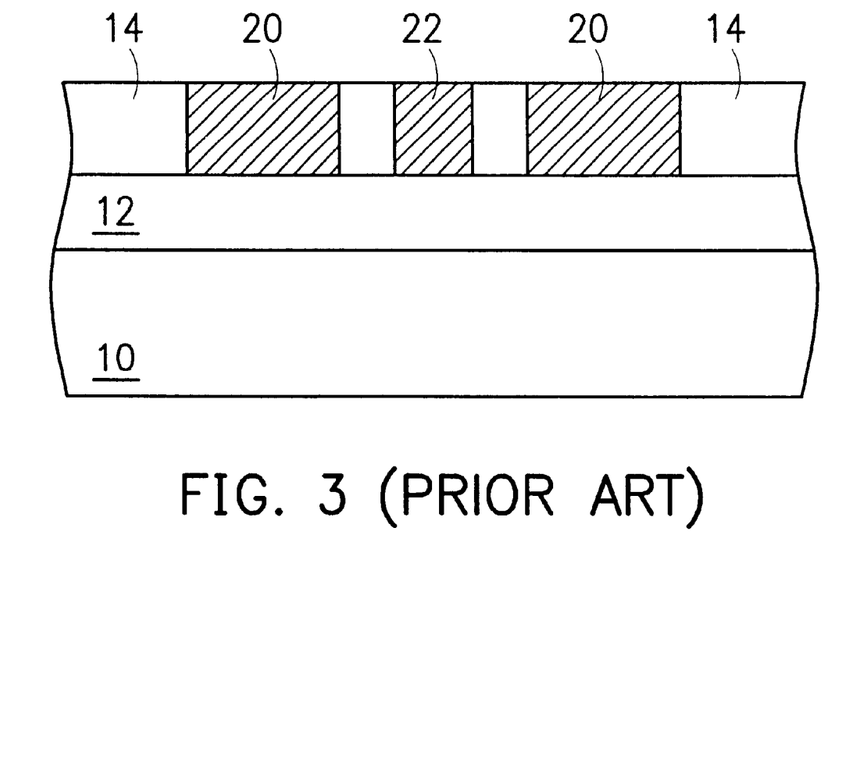

In FIG. 3, the openings 16 are filled with metal material by a typical damascene manner, so as to form the wiring lines 20, 22. The damascene manner typically includes depositing a blanket metal layer over the carbon layer 14, and polishing away the top portion of the metal layer. The residual metal layer fills the openings 16 to form the wiring lines 20, 22.

Figure 4:
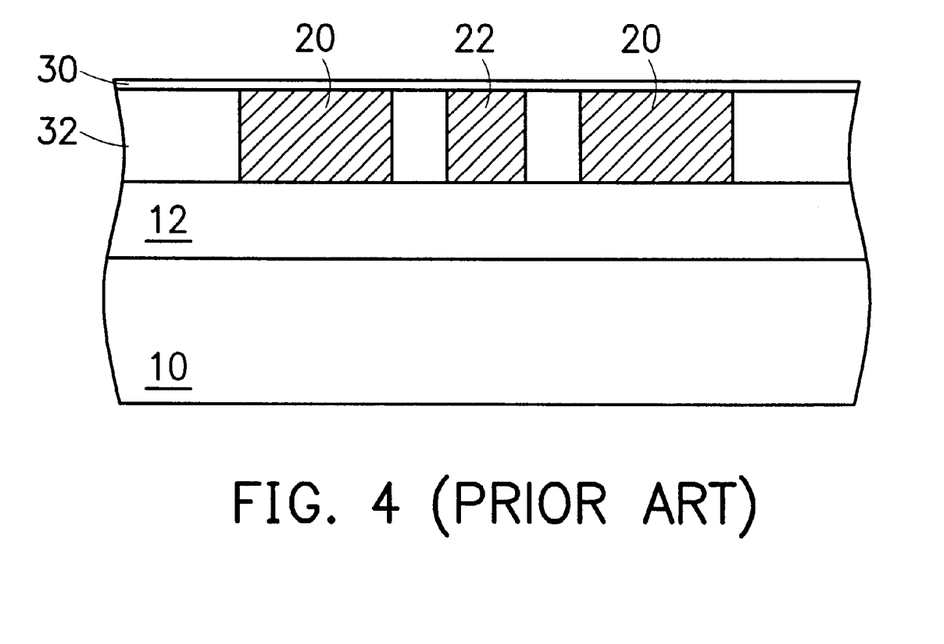
Figure 5:
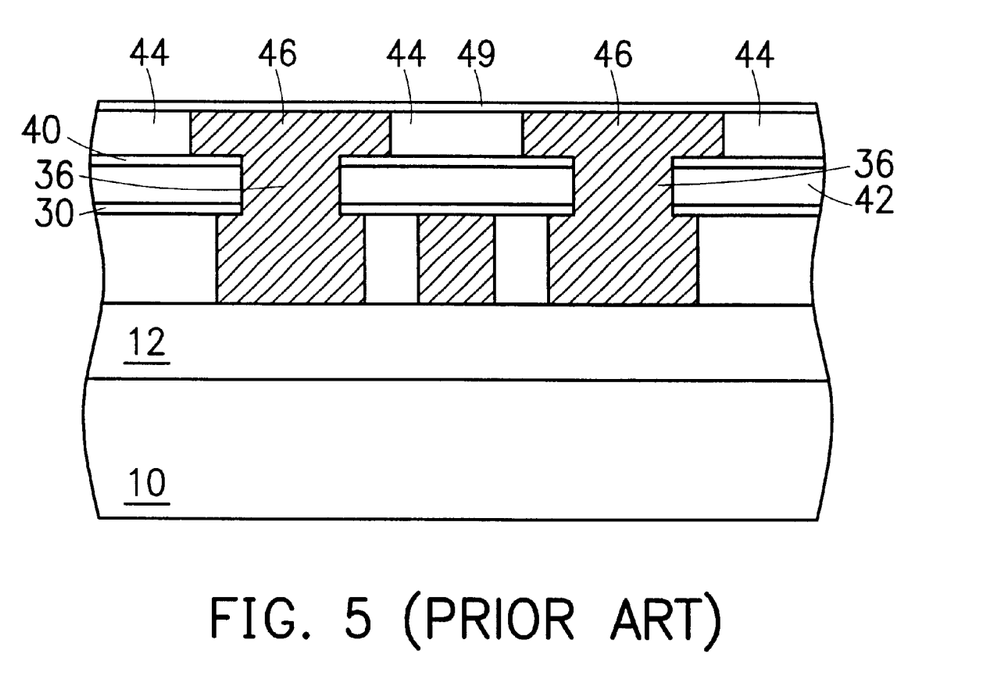

In FIG. 4, a thin silicon oxide layer 30 is formed to cover the carbon layer 14 and the wiring lines 20, 22. The substrate 10 with the carbon layer covered by the silicon oxide layer 30 is placed in a furnaces holding an oxygen ambient and heated to a temperature of 400° C.–500° C. for approximately two hours. In this environment, oxygen readily diffuses through the thin oxide layer 30 to react with the carbon layer 14, forming $CO_2$ which diffuses back through the thin oxide layer and escapes. After two hours ashing period, the entire carbon layer 14 is consumed, leaving behind air gaps 32 between the oxide layer 30 and the dielectric layer 12 and separating the first level wiring lines 20, 22, as shown in FIG. 4. This process can then be repeated to produce the multilevel interconnect structure shown in FIG. 5, which is also the structure shown in FIG. 1. The via interconnects 36 in the inter-metal dielectric layer 42 is formed to connect to a next level interconnect 46 that are to be formed. The second level interconnect 46 is continuously formed by repeating similar process of depositing and patterning the carbon layer, and filling the interconnect 46. The silicon oxide layer 49 is formed covering the carbon layer 52 and the second level interconnect 46, such as the wiring lines. The carbon is evaporated away to leave the air gap 44.

In the conventional interconnect structure as shown in FIG. 1, the air gap is included. This can effectively reduce the capacitance of the interconnect dielectric layer. However, if a misalignment occurs during forming openings for the wiring lines, an unlanded via or wiring line would be formed. This is often when the device integration greatly increases. In this situation, the unlanded opening may also penetrate through the thin silicon oxide layers 30, 40, 49, and improperly expose the air gaps. When the material for via or wiring line to deposited into the unlanded opening, the material also enters the air gap, causing a failure of the device.

SUMMARY OF THE INVENTION

As embodied and broadly described herein, the invention provides an interconnect structure with air gap. A conductive structure, such as an unlanded via or a wiring line, can be formed without improperly penetrating into an undesired region of the interconnect structure.

The interconnect structure includes a substrate which has devices already formed thereon. A dielectric layer covers over the substrate. A conductive structure enclosed by an air gap is formed on the dielectric layer. A capping layer covers the conductive structure and the air gap. The capping layer at a portion above the air gap also fills into the air gap by a predetermined distance. The air gap may also extend into the dielectric layer to have a greater height. An etching stop layer is formed on the capping layer. An inter-metal dielectric layer is formed on the etching stop layer. The inter-metal dielectric layer, the etching stop layer and the capping layer are patterned to form an opening that exposes a top surface of the conductive structure. The opening may also expose a top portion of a sidewall of the conductive structure if a misalignment occurs, but the opening does not expose the air gap due to protection from the predetermined distance of the capping layer within the air gap. A next level of conductive structure can be formed to fill the opening.

In the foregoing, if a multilevel interconnect structure is desired, multiple levels of air gap associating with multiple capping layers and etching stop layers can be repeatedly formed under the inter-metal dielectric layer.

A liner layer can be also formed on a sidewall of the substructure interfacing the air gap, so as to protect the conductive structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

As known by prior artisans, an air gap can effectively reduce parasitic capacitance of an interconnect structure due to the inter dielectric layer, such as the intermetal electric layer. However, an effective air gap associating with the inter dielectric layer to form an interconnect structure is still not well specifically known in the prior skills. The invention introduces various interconnect structures incorporated with air gap, so as to effectively reduce the parasitic capacitance of the interconnect structure.

The air gap is also a dielectric with dielectric constant k=1. In the following description and the claims, the term of air gap means an air dielectric, a gas gap, a gas dielectric, or any gas-phase dielectric.

First Embodiment

Figure 6A:
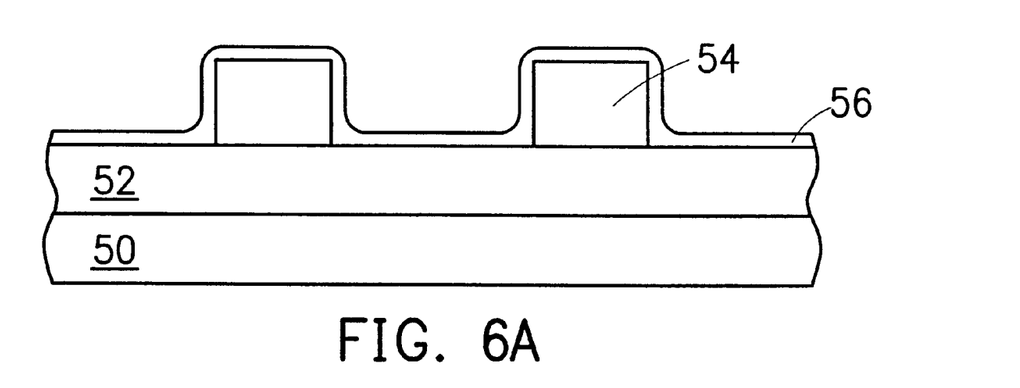
FIGS. 6A–6D are cross-sectional views, schematically illustrating a process to form an interconnect structure, according to the first preferred embodiment of the invention.

FIGS. 6A–6D are cross-sectional views, schematically illustrating a process to form an interconnect structure, according to the first preferred embodiment of the invention. In FIG. 6A, a substrate 50 may have a device (not shown) formed thereon. A dielectric layer 52 is formed over the substrate 50, by for example, chemical vapor deposition (CVD). The dielectric layer 52 may also be planarized by, for example, CMP process. A conductive structure 54, such as wiring lines 54, is formed on the dielectric layer 52. The conductive structure 54 can be formed by, for example, a deposition associating with patterning or by a damascene manner. This embodiment, for example, is formed by forming a blanket conductive layer and patterning the blanket conductive layer. The conductive layer preferably includes copper, tungsten, aluminum, aluminum alloy, polysilicon, metal, and metal alloy. Usually, a liner layer 56 can also be formed over the substrate for protection. The liner layer 56 at least covers a portion of the conductive structure.

Figure 6B:
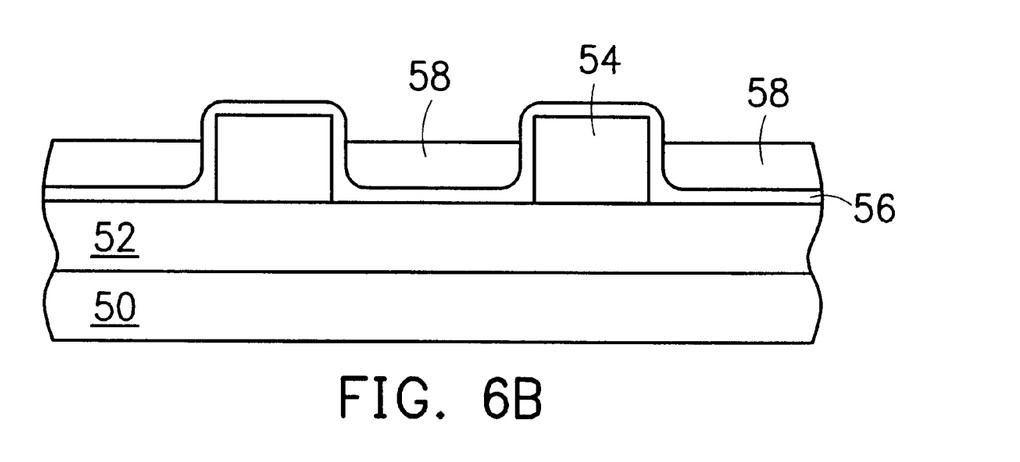

In FIG. 6B, a preliminary sacrificial layer is formed over the substrate to fill the gap between the wiring lines 54, and a top portion of the preliminary sacrificial layer is removed. As a result, the sacrificial layer 58 fills the gap between the wiring lines 54 at the bottom portion. The space occupied by the sacrificial layer 58 is the space to be formed into the air gap as is to be described later. A top surface of the sacrificial layer 58 is lower than a top surface of the wiring lines 54 by a predetermined distance, serving an etching protection in the subsequent process. In order to form the air gap, the sacrificial layer 58 is necessary to be removed but a cap layer is needed to cover the removed space. This can be done, for example, by the process shown in FIG. 6C.

Figure 6C:
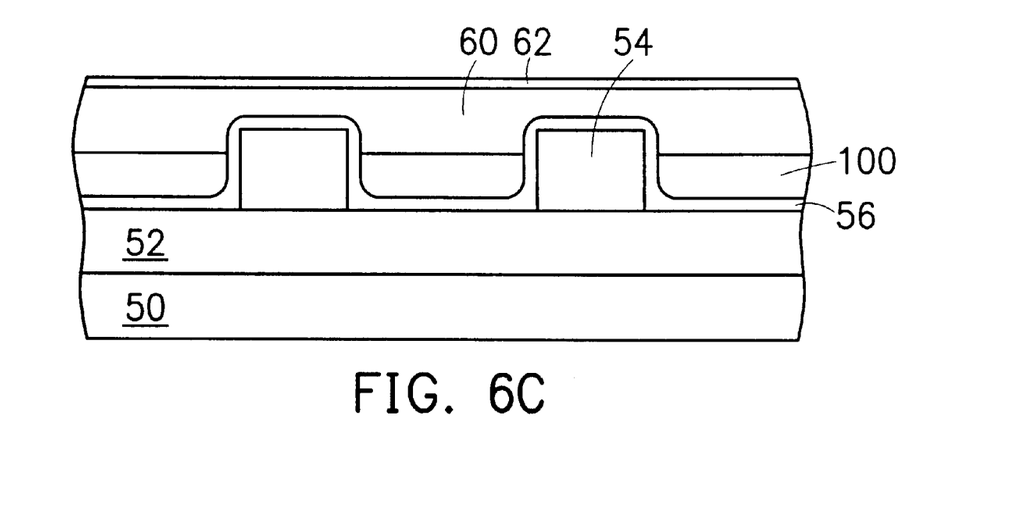

In FIG. 6C, a capping layer 60 is formed over the substrate 50, to cover a top topographic surface of the substrate 50, where the capping layer 60 fills up the gap between the wiring lines 54. In general, the sacrificial layer 58 includes a material which can be reacted away without removing other structures. The sacrificial layer 58 of FIG. 6B preferably includes, for example, carbon, photoresist, organic polymer, or carbon-rich material, which can be reacted away under a thermal environment. The capping layer includes, for example, dielectric, oxide, porous dielectric, or hydrogen silsesquioxane (HSQ). Preferably, the sacrificial layer 58 is a carbon layer since carbon can be easily reacted away in the thermal oxygen ambient. Carbon usually has no residual product from reaction, but other materials may leave some residual products.

Then, the substrate 50, for example, is placed in a furnace holding an oxygen ambient and heated to a temperature of 400° C.–450° C. for about two hours. In this environment, oxygen readily diffuse through the capping layer 60 to react with the sacrificial layer 58, forming molecules, such as $CO_2$. The molecules diffuses or back through the capping layer 60 and escapes. The space originally occupied by the sacrificial layer 58 now is the air gap 100. In order to have better efficiency to form the air gap, the thickness and the density of the capping layer 60 is optimized, so that the capping layer 60 can protect etching effect from the subsequent etching process as to be seen later and also allow the molecules to easily escape. A less material density of the capping layer allows the reacted product to be easier escape. However, the optimal fabrication conditions are the design choice. After the air gap 100 is formed, an etching stop layer 62 is formed on the capping layer. Planarization process may also be applied to the capping layer 60 or the etching stop layer 62.

Figure 6D:
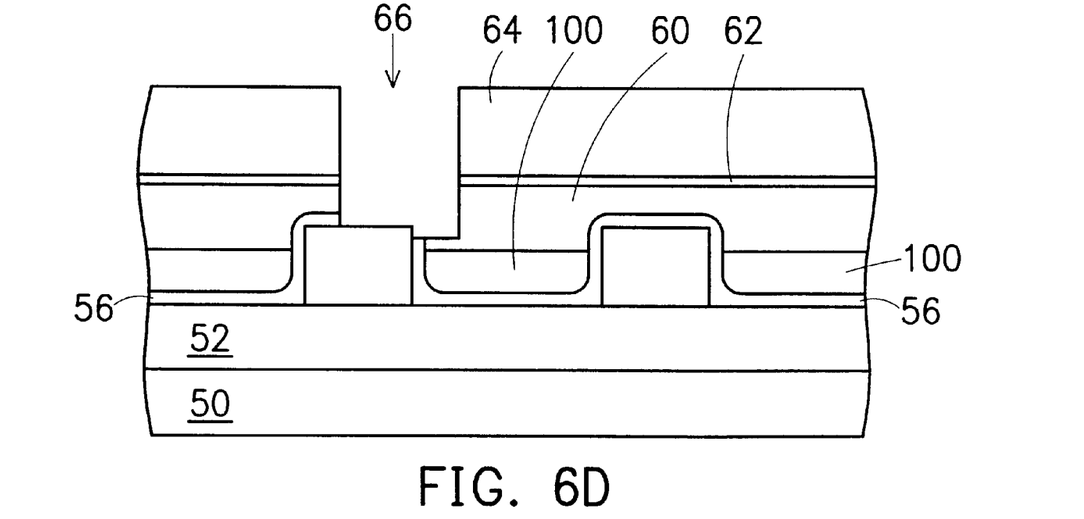

In FIG. 6D, a dielectric layer 64 is formed on the etching stop layer 62. An opening 66, such as a via opening, is formed in the dielectric layer 64, the etching stop layer 62, and the capping layer 60 by patterning those layers. If there is a liner layer 56, the liner layer is also etched. As a result, the opening 66 exposes a top surface of the conductive structure 54. If a misalignment occurs to the opening 66, so called unlanded 10 opening, the opening also expose a top portion of sidewall of the conductive structure 54, but without etching through the capping layer due to protection from the reserved distance as described in FIG. 6B. Therefore, the capping layer also protect the etching effect from etching through the air gap 100.

The role of the etching stop layer is to ease the etching of the dielectric layer 64 for forming the opening 66. Usually, if the dielectric layer 64 includes oxide, doped dielectric, fluorine doped oxide, or low dielectric-constant material, the etching stop layer 62 then includes nitride, silicon oxynitride (SiON), $Al_2O_3$ AlN, SiC, or AlSi, so as to have a significant etching selectivity between dielectric and stop layer. The dielectric layer 64 usually is thick, since it usually also associates with other devices formed at other portions of the substrate 50 (not shown). The dielectric layer may be etched by two stages. The first etching stage takes a rather high etching speed, so as to fast etch the most thickness of the dielectric layer 64. The second etching stage takes a rather large etching selectivity between the etching stop layer 62 and the dielectric layer 64, so that a top portion of the opening 66 is formed to expose the etching stop layer 62, until the global etching on the dielectric layer 64 at the other portions are also done. Here, the etching stop layer 62 may also be etched but not through. Then, the etching process, by for example changing etchant, continuously etches through the etching stop layer 62 and a portion of the capping layer 60 until the conductive structure 54 is exposed.

The subsequent processes to complete the interconnect by filling the opening 66 with a conductive plug (not shown) are known by one skilled in the art, and are not further described. In the embodiment only two levels are described. If the interconnect structure is a multilevel structure, the air gap can be repeatedly formed associating another capping layer or the etching stop layer with a similar features of the air gap 100 and the capping layer 60.

Second Embodiment

Figure 7A:
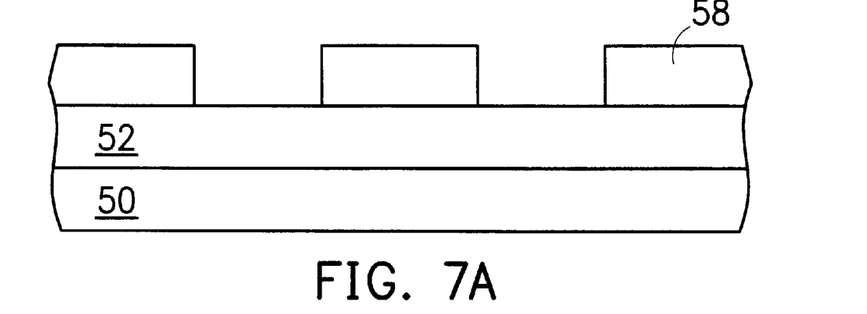
FIGS. 7A–7E are cross-sectional views, schematically illustrating a process to form an interconnect structure, according to the third preferred embodiment of the invention.

FIGS. 7A–7E are cross-sectional views, schematically illustrating a process to form an interconnect structure, according to the third preferred embodiment of the invention. The interconnect structure may also be formed by a damascene manner, particularly when the conductive structure includes copper, aluminum (Al), or tungsten, or even metal alloy. The damascene interconnect structure can be, for example, formed by the process shown in FIGS. 7A–7E. In FIG. 7A, the sacrificial layer 58 is formed on the dielectric layer 52. The sacrificial layer 58 is then patterned to form an opening where is the place the conductive structure is to be formed by damascene.

Figure 7B:
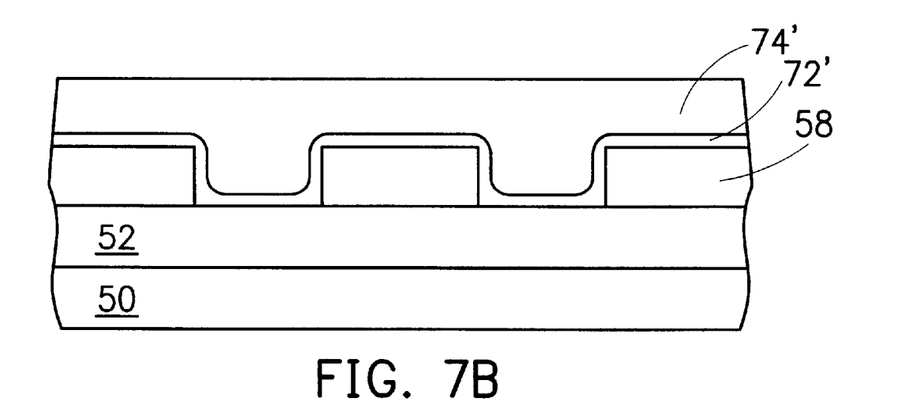
Figure 7C:
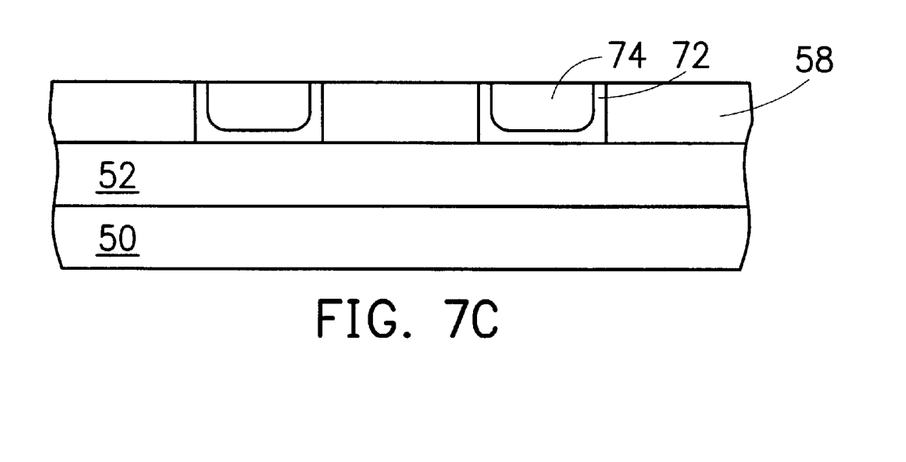

In FIG. 7B, if a conformal liner layer 72' is desired, it can be formed over the substrate 50. A preliminary conductive layer, such as a copper layer or tungsten layer is blanket deposited over the substrate 50. In FIG. 7C, a planarization process, such as a chemical mechanical polish (CMP) process, is performed to remove the top portion of the conductive layer 74', and maybe the liner layer 72' if the liner layer 72' is included. The conductive structure 74 and the liner layer 72 is formed. The liner layer 72 further protects the conductive structure 74 on the dielectric layer 52.

Figure 7D:
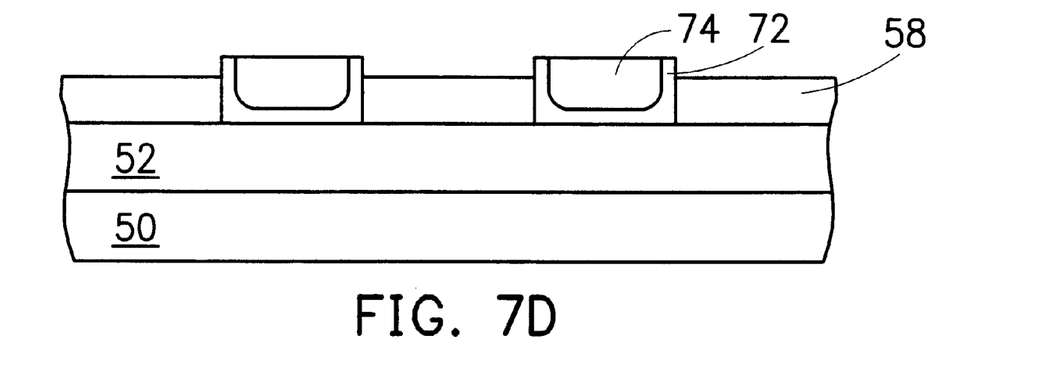
Figure 7E:
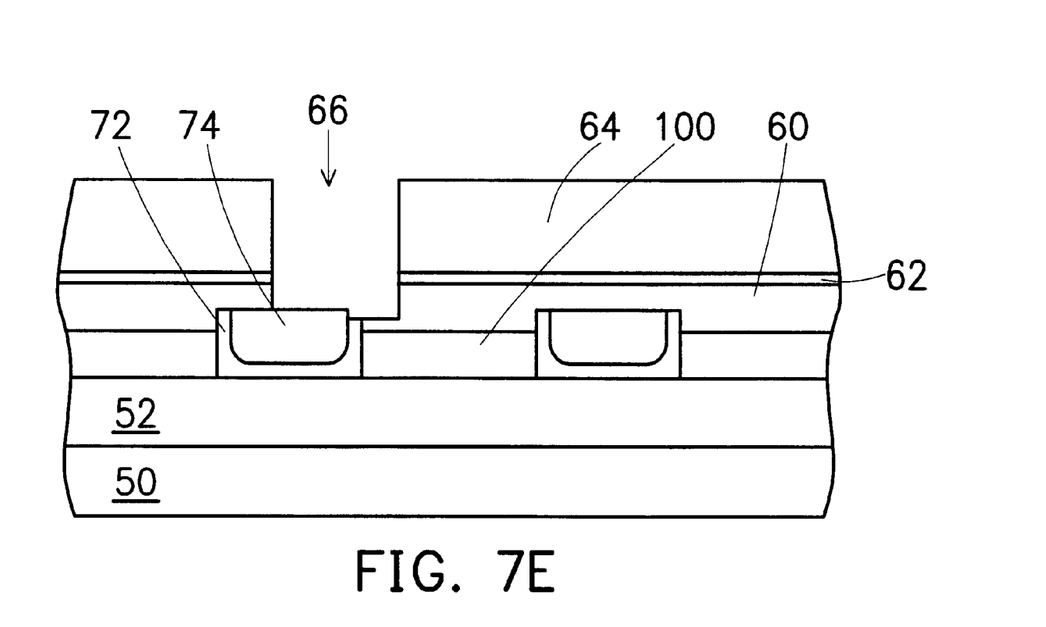

In FIG. 7D, the sacrificial layer 58 is recessed to have a distance lower than a top surface of the conductive structure 74, serving for protection. In FIG. 7E, similar to the previous embodiments, the capping layer 60, the air gap 100, the etching stop layer 62, the dielectric layer 64, and the opening 66 are according formed.

A conductive plug (not shown) is then formed to fill the opening 66. If the interconnect structure is a multilevel structure, the air gap can be repeatedly formed associating another capping layer or the etching stop layer with a similar features of the air gap 100 and the capping layer 60.

Third Embodiment

As discussed in the beginning, the air gap can effectively reduce the parasitic capacitance. If the dimension of air gap is larger, it has more effect. One way to increase the dimension of the air gap is increasing the height. In the following embodiment, an air gap with greater height is introduced.

Figure 8A:
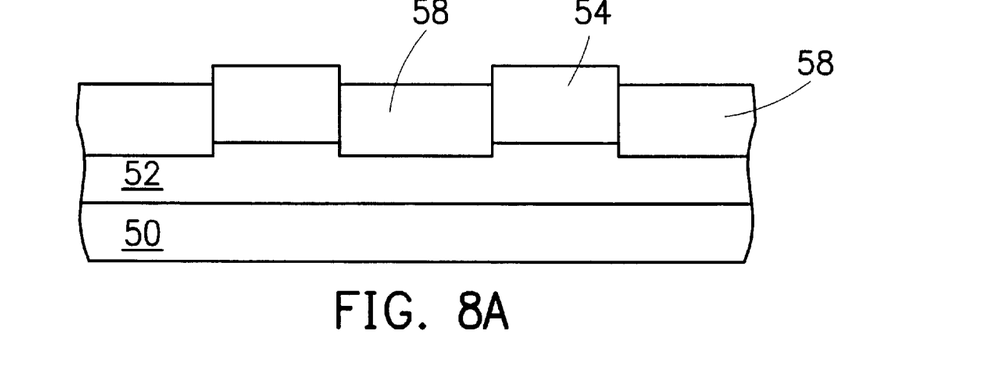
FIGS. 8A–8C are cross-sectional views, schematically illustrating a process to form an interconnect structure, according to the fourth preferred embodiment of the invention.
Figure 8B:
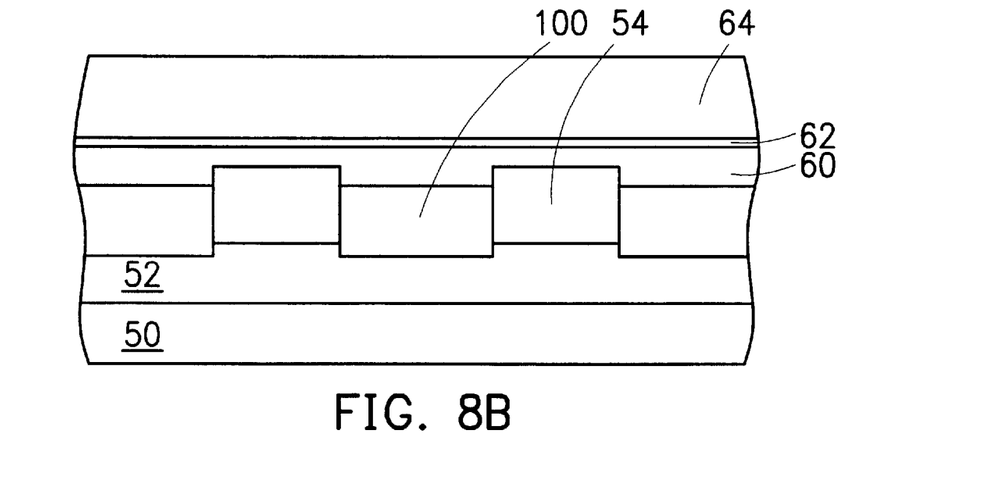
Figure 8C:
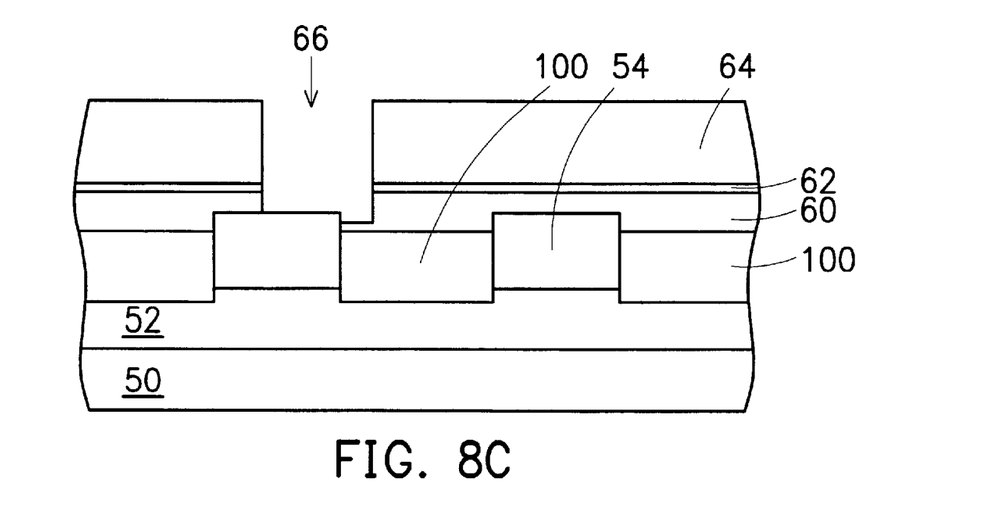

FIGS. 8A–8C are cross-sectional views, schematically illustrating a process to form an interconnect structure, according to the forth preferred embodiment of the invention. In FIG. 8A, the conductive structure 54 is formed on the dielectric layer 52. The gap between the wiring lines of the conductive structure 54 has a further space entering the dielectric layer 52. It can be, for example, achieved by etching the dielectric layer 52 to form a shallow opening or a shallow recess region serving as the bottom portion of the desired air gap, which is to be formed later. Then, the sacrificial layer 58 is formed to partially fill the gap between the wiring lines 54 with a distance from the top surface of the wiring lines 54.

In FIG. 8B, similarly to the first embodiment, the capping layer 60 is formed over the substrate 50 to cover the conductive structure 54 and the sacrificial layer 58 of FIG. 8A. The sacrificial layer 58 is consumed away by reaction, so that the air gap 100 is formed. The air gap 100 includes at least one with greater height.

In FIG. 8C, the opening 66 formed in the dielectric layer 64, the etching stop layer 62, and the capping layer 60, so as to expose the conductive structure 54. The opening 66 is shown in an unlanded opening.

A conductive plug (not shown) is then formed to fill the opening 66. If the interconnect structure is a multilevel structure, the air gap can be repeatedly formed associating another capping layer or the etching stop layer with a similar features of the air gap 100 and the capping layer 60. If a liner layer is desired, it can be formed on the peripheral surface of the conductive structure similarly to the previous liner layer.

Fourth Embodiment

Figure 9A:
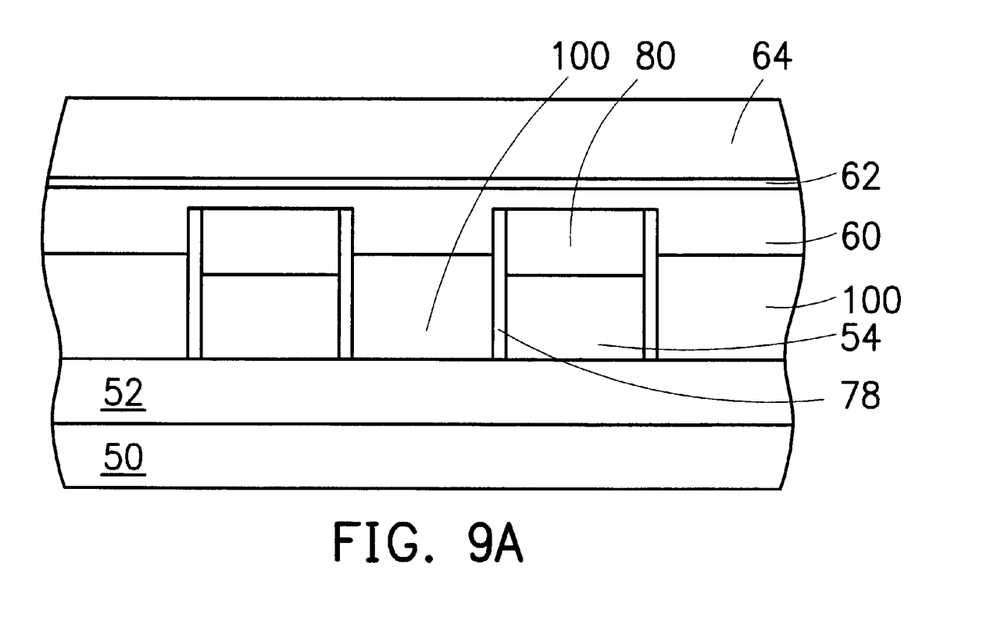
FIGS. 9A–9B are cross-sectional views, schematically illustrating a process to form an interconnect structure, according to the fifth preferred embodiment of the invention.
Figure 9B:
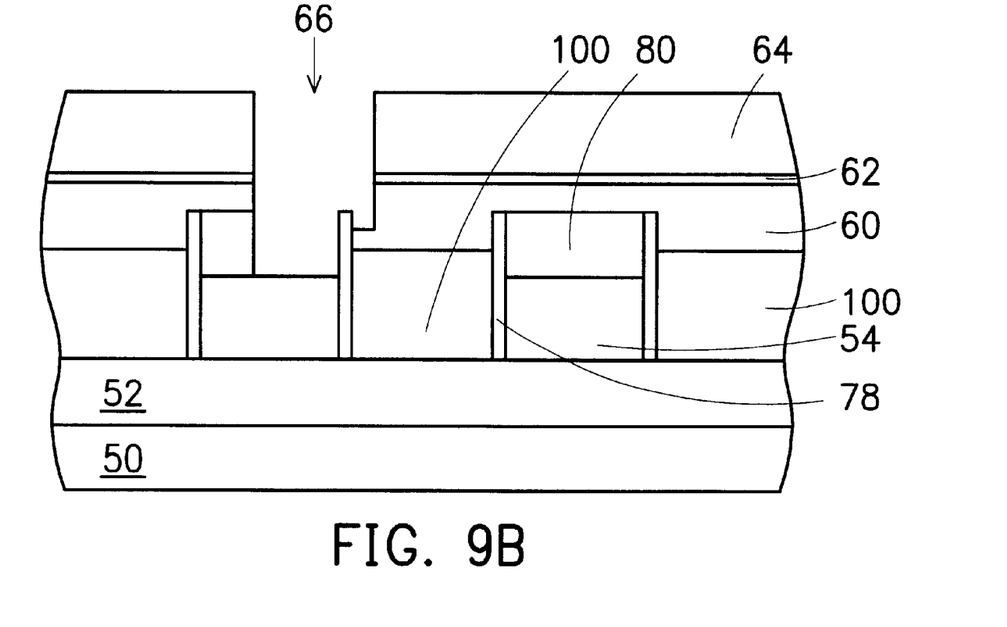

The interconnect structure can be further modified to have greater height of the air gap. FIGS. 9A–9B are cross-sectional views, schematically illustrating a process to form an interconnect structure, according to the fifth preferred embodiment of the invention. In FIG. 9A, an additional cap layer 80 is formed on the conductive structure 54. A side dielectric layer 78, such as a spacer, is formed on sidewalls of the conductive structure 54 and the cap layer 80. The capping layer 60, the etching stop layer 62 and the dielectric layer 64 are similarly formed over the substrate 50, like the previous embodiment, where the air gap 100 is formed also through a sacrificial layer that is consumed away later. The air gap 100 is enclosed by the side dielectric layer 78 from side in this embodiment. This side dielectric layer 78 can prevent the cap layer 80 from being etched through, resulting in exposing the air gap 100. The cap layer 80 is chosen to include a material, which has an higher etching ratio to the capping layer 60 and also the side dielectric layer 78. Preferably, the cap layer 80 is made of doped dielectric, such as phosphosilicate glass (PSG) or borophosphosilicate glass (BPSG), usually has a faster etching ratio to the capping layer 60. The cap layer 80 at least produces two advantages. One is that the thickness of the cap layer 80 increases the height of the air gap. One is that a self-aligned unlanded opening can be formed.

In FIG. 9B, the opening 66 is formed in the dielectric layer 64, the capping layer 60, the etching stop layer 62, and the dielectric cap 80. Since the dielectric cap 80 is etched faster than the capping layer 60 and the spacer 78 is etched without significant amount, the dielectric cap 80 is etched in a self-aligned manner. The spacer 78, the capping layer 60 and the dielectric layer 52 enclose the air gap 100 without destruction on the air gap 100.

Figure 10:
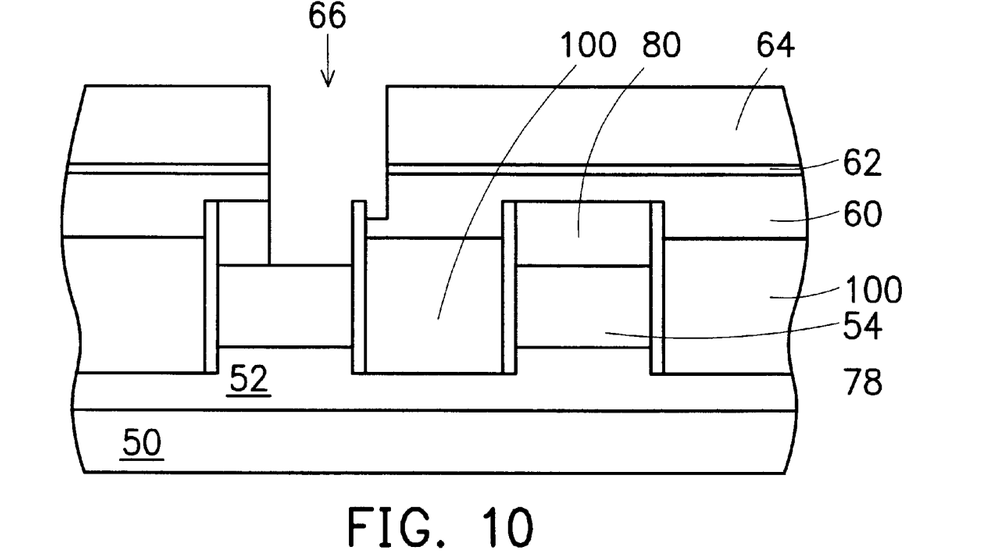
FIG. 10 is a cross-sectional view, schematically illustrating another interconnect structure, according to the fifth preferred embodiment of the invention.

As described before, the height of the air gap 100 can be further extended into the dielectric layer 52 as shown in FIG. 10. In the situation, a shallow opening can be formed in the dielectric layer 52 at the desired places. It can also be formed by using the conductive structure 54 as an etching mask to etch the dielectric layer 52.

A conductive plug (not shown) is then formed to fill the opening 66. If the interconnect structure is a multilevel structure, the air gap can be repeatedly formed associating another capping layer or the etching stop layer with a similar features of the air gap 100 and the capping layer 60. If a liner layer is desired, it can be formed on the peripheral surface of the conductive structure similarly to the previous liner layer.

Fifth Embodiment

The air gap can effectively reduce the parasitic capacitance of the interconnect structure. However, the air gap does not provide a supporting effect for the structure. If the air gap between the conductive structure extends too wide, the capping layer and other upper layers may have no sufficient mechanical strength to hold the structure. A sag or breakage could occurs above the wide air gap. In order to avoid this kind of problem, a dummy structure can be simultaneously formed at the location with loose structure density.

Figure 11:
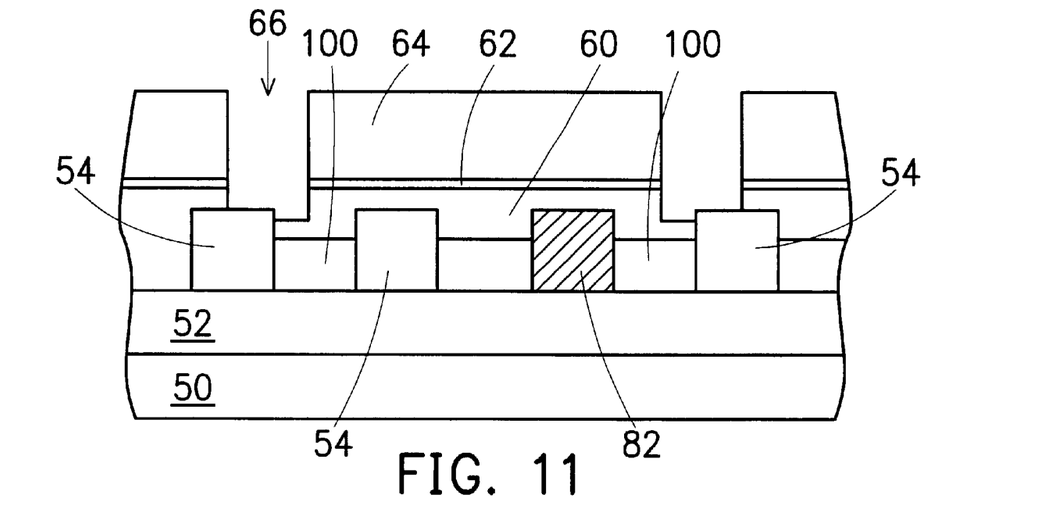
FIG. 11 is a cross-sectional view, schematically illustrating an interconnect structure, according to the sixth preferred embodiment of the invention.

FIG. 11 is a cross-sectional view, schematically illustrating an interconnect structure, according to the sixth preferred embodiment of the invention. In FIG. 11, the dummy structure 82 can be simultaneously formed together with the conductive structure 54 at the weak mechanical point. The dummy structure 82 is made of, for example, conductive or dielectric materials, which depends on requirements of design. The other elements, similar to the previous embodiment, can be formed without a special process. The detail example of fabrication processes are not described again here.

If the interconnect structure is a multilevel structure, the air gap can be repeatedly formed associating another capping layer or the etching stop layer with a similar features of the air gap 100 and the capping layer 60.

Sixth Embodiment

In the foregoing embodiment, the protection distance, that is, the exposed portion of the sidewall of the conductive structure is formed. However, a precise quantity of the protection distance may be not easily controlled by recessing the sacrificial layer. A precise quantity can be controlled by employing an intermediate dielectric layer that has a thickness equal to the protection distance.

Figure 12A:
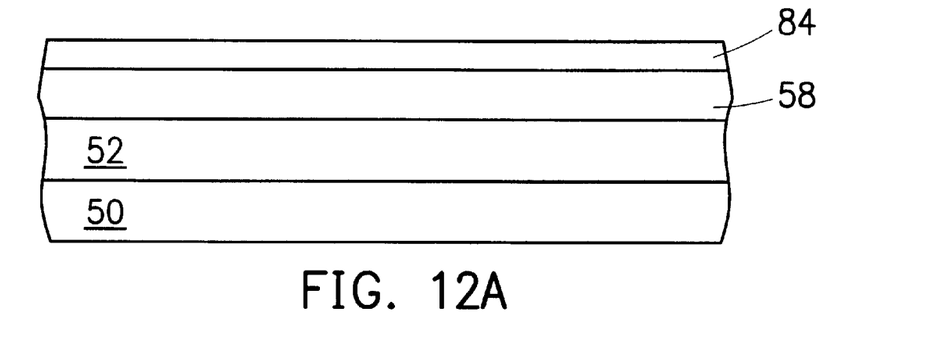
FIGS. 12A–12F are a cross-sectional views, schematically illustrating a process to form an interconnect structure, according to the seventh preferred embodiment of the invention.

FIGS. 12A–12F are a cross-sectional views, schematically illustrating a process to form an interconnect structure, according to the seventh preferred embodiment of the invention. In FIG. 12A, the sacrificial layer 58 is formed on the dielectric layer 52. Before patterning the sacrificial layer 58, a dielectric layer 84 is formed on the sacrificial layer 58. The thickness of the dielectric layer 84 is determined by a desired protection distance. Since the thickness of the dielectric layer 84 can be precisely controlled without problem. This allows the protection distance to be precisely and easily controlled.

Figure 12B:
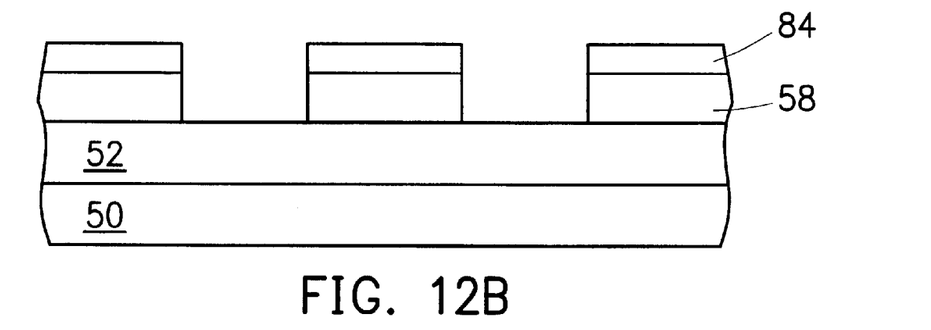
Figure 12C:
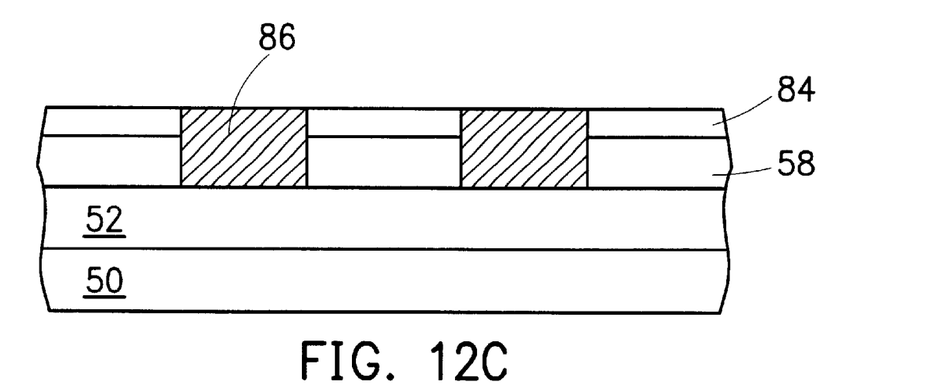

In FIG. 12B, the dielectric layer 84 and the sacrificial layer 58 are patterned to form an opening at a desired location where a conductive structure is to be deposited thereon. In FIG. 12C, a conductive structure 86 is formed to fill the opening by, for example, the damascene manner. The damascene manner includes, for example, forming a blanket conductive layer over the substrate, at least filling the opening, and polishing or etching back the blanket conductive layer to expose the dielectric layer, which usually is hard serving as a stop. The polishing process include, for example, a CMP process. As a result, the conductive structure 86 is formed on the dielectric layer 52 and surrounded by the sacrificial layer 58 and the dielectric layer 84.

Figure 12D:
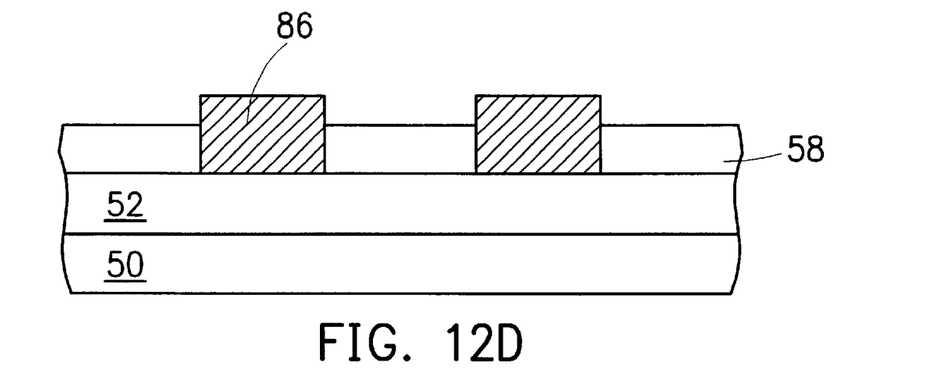

In FIG. 12D, the dielectric layer 84 is removed, leaving a recess region of the sacrificial layer 58. Since the thickness of the dielectric layer 84 is precisely controlled, the protection distance is precisely controlled also.

Figure 12E:
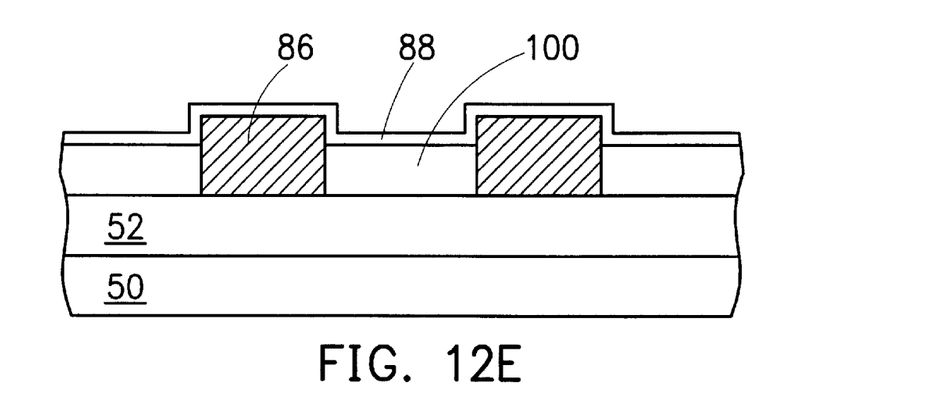

In FIG. 12E, a capping layer 88, conformal to a topographic surface, is formed over the substrate 50. Then, the sacrificial layer 58 is consumed away through the capping layer 88, leaving an air space. The air space is referred as the air gap 100 surrounding the conductive structure 86.

Figure 12F:
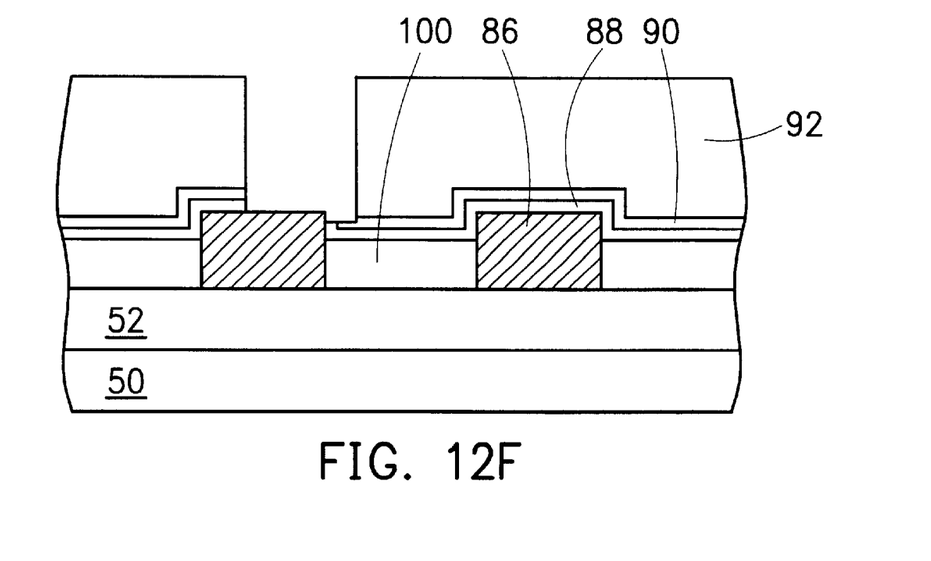

In FIG. 12F, an etching stop layer 90, conformal to the capping layer 88, is formed on the capping layer 88. A dielectric layer 92 is formed on the etching stop layer 90. An opening is formed by patterning the dielectric layer 92, the etching stop layer 90, and the capping layer 88, so as to expose the conductive structure 86. If the opening is an unlanded opening due to misalignment, the opening also exposes a top portion of sidewall of the conductive structure 86 but does not expose the air gap 100 due to protection by the protection distance. The opening can stop in the etching stop layer 90, or even reach to the capping layer 88. Since the capping layer 88 is thin and has covered a portion of sidewall of the conductive structure 86, the opening may only stop in the etching stop layer 90 when the opening exposes the conductive structure 86. However, the opening may also etch through the etching stop layer but not etch through the capping layer. The etching stop layer 90 mainly is used to stop the etching process for the second dielectric layer 92 in the foregoing descriptions.

If the interconnect structure is a multilevel structure, the air gap can be repeatedly formed associating another capping layer or the etching stop layer with a similar features of the air gap and the capping layer.

The invention has introduced various embodiments. In general, the embodiments can be selectively combined into a desired structure without loosing the features.

In conclusion, the interconnect structure of the invention at least has alternatively several features as follows:

1. An etching stop layer and a capping layer covers the conductive structure and the air gap. The etching stop layer allows the unlanded via opening to be formed with uniformity since the etching stop layer can decrease etching speed. The etching stop layer can prevent a sever over-etching from occurring at some place needing only a smaller etching depth. The etching process can stop on the etching stop layer to have a uniform etching depth, and then the etching process continues to etch the desired places having about the same etching depth. In general, the etching stop layer is used to adjust etching speed to avoid over etching and therefore to achieve the etching uniformity. The capping layer protects the air gap from being penetrated.
2. A liner layer covers a portion of the conductive structure for protection.
3. The height of the air gap is increased by extending the air gap into the underlying dielectric layer.
4. The height of the air gap is also increased by including a dielectric cap on the conductive structure, where the dielectric cap preferably is a doped dielectric with a faster etching rate to the dielectric layer 64, so that the unlanded opening has a self-aligned etching property.
5. The dummy structure at the place with a loose device density can provide additional holding effect.
6. The protection distance to the air gap can be precisely controlled by employing a dielectric layer. The thickness is equal to the protection distance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming an interconnect structure, comprising:

providing a substrate;

forming a sacrificial layer on the substrate;

forming a sacrificial dielectric layer on the sacrificial layer, wherein the sacrificial dielectric layer has a thickness;

patterning the sacrificial layer and the sacrificial dielectric layer to form an opening exposing the substrate;

forming a conductive structure filling the opening;

removing the sacrificial dielectric layer to expose the sacrificial layer;

forming a conformal capping layer over the substrate to cover the conductive structure and the sacrificial layer;

performing a consumption process to remove the sacrificial layer, so as to form an air gap surrounding the conductive structure;

forming a conformal etching stop layer on the conformal capping layer;

forming a second dielectric layer on the etching stop layer;

patterning the second dielectric layer, the conformal etching stop layer, and the conformal capping layer to form an opening that exposes a portion of the conductive layer but not the air gap; and forming a plug filling the opening.

2. The method of claim 1, wherein the step of patterning the second dielectric layer, the conformal etching stop layer, and the conformal capping layer comprises a first etching stage to etch the second dielectric layer but stop in the conformal etching stop layer, which may be etched also but not etched through.

3. The method of claim 1, wherein the step of patterning the second dielectric layer, the conformal etching stop layer, and the conformal capping layer comprises a second etching stage to etch through the conformal etching stop layer and the conformal capping layer to expose the conductive structure.

4. The method of claim 1, wherein the step of performing the consumption process to remove the sacrificial layer comprises a thermal reaction under an oxygen ambient, so that only the sacrificial layer is consumed away without removing the conformal capping layer.

5. The method of claim 1, wherein the conductive structure and the plug each comprise one material selected from a group consisting of copper, tungsten, aluminum, polysilicon, and metal.

6. The method of claim 1, wherein the conformal capping layer comprises one material selected from a group consisting of dielectric, oxide, porous dielectric, and hydrogen silsesquioxane.

7. The method of claim 1, wherein the sacrificial layer comprises one selected from a group consisting of carbon, photoresist, organic polymer, and carbon-rich material.

8. The method of claim 1, wherein in the step of providing the substrate, the substrate includes a recess region at a location where the air gap is to be formed, so that the air gap extends into the substrate.

9. The method of claim 1, wherein the second dielectric layer includes one material selected from a group consisting of oxide, fluorine doped oxide, doped dielectric, and low dielectric-constant material.

10. The method of claim 1, wherein in the step of forming the conductive structure, the conductive structure comprises a dummy portion, not used for interconnecting but used for providing mechanical supporting strength of the interconnect structure.

11. The method of claim 10, wherein the dummy portion is made of dielectric materials.

12. The method of claim 10, wherein the dummy portion is made of conductive materials.

* * * * *